(12) United States Patent
Shinohara (10) Patent No.: US 10,975,267 B2
(45) Date of Patent: *Apr. 13, 2021

(54) ANISOTROPIC CONDUCTIVE FILM AND CONNECTION STRUCTURE

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

(\*) Notice: Subject to any disclaimer, the term of this patent is extended or adjusted under 35 U.S.C. 154(b) by 49 days.

This patent is subject to a terminal disclaimer.

(21) Appl. No.: 15/509,359

(22) PCT Filed: Oct. 2, 2015

(86) PCT No.: PCT/JP2015/078012
§ 371 (c)(1),
(2) Date: Mar. 7, 2017

(87) PCT Pub. No.: WO2016/067828
PCT Pub. Date: May 6, 2016

(65) Prior Publication Data
US 2017/0278820 A1    Sep. 28, 2017

(30) Foreign Application Priority Data

Oct. 28, 2014   (JP) .............................. JP2014-219785

(51) Int. Cl.
*H01R 13/24* (2006.01)
*H01L 23/00* (2006.01)
(Continued)

(52) U.S. Cl.
CPC ................. *C09J 7/10* (2018.01); *C08K 3/08* (2013.01); *C09J 9/02* (2013.01); *C09J 11/04* (2013.01);
(Continued)

(58) Field of Classification Search
CPC ... H01L 24/29; H01L 24/83; C09J 7/10; C09J 11/04; C09J 9/02; C09J 2203/326;
(Continued)

(56) References Cited

U.S. PATENT DOCUMENTS 5,672,400 A * 9/1997 Hansen ................... B32B 27/00
428/40.1
2011/0110066 A1* 5/2011 Yamada ..................... C09J 9/02
361/803

(Continued)

FOREIGN PATENT DOCUMENTS

JP    2003-286457 A    10/2003
JP    2007-080522 A    3/2007
(Continued)

OTHER PUBLICATIONS

Jul. 4, 2018 Office Action issued in Chinese Patent Application No. 201580055622.7.
(Continued)

*Primary Examiner* — Michael N Orlando
*Assistant Examiner* — Christian Roldan
(74) *Attorney, Agent, or Firm* — Oliff PLC (57) ABSTRACT

An anisotropic conductive film including an electrically insulating adhesive layer, and electrically conductive particles disposed on the electrically insulating adhesive layer. In such an anisotropic conductive film, the electrically conductive particles are disposed in a lattice by being arranged in first direction rows and second direction rows, and narrow and wide intervals are provided between neighboring rows in at least one of the direction rows. As a result, opposing terminals are stably connected using the anisotropic conductive film, inspection after the connecting is more easily performed, and the number of electrically conductive particles not involved in the connection are reduced and, (Continued)

thereby, the manufacturing cost of the anisotropic conductive film is reduced, even in FOG connections or the like with finer bump pitches.

17 Claims, 5 Drawing Sheets

(51) Int. Cl.
    *C09J 7/10*           (2018.01)
    *H01R 11/01*         (2006.01)
    *C09J 11/04*         (2006.01)
    *C08K 3/08*          (2006.01)
    *C09J 9/02*           (2006.01)
    *H01B 1/22*          (2006.01)

(52) U.S. Cl.
    CPC ............... *H01B 1/22* (2013.01); *H01L 24/29* (2013.01); *H01L 24/83* (2013.01); *H01R 11/01* (2013.01); *H01R 13/2414* (2013.01); *C08K 2201/001* (2013.01); *C09J 2203/326* (2013.01)

(58) Field of Classification Search
    CPC ............... C08K 3/08; C08K 2201/001; H01R 13/2414; H01R 11/01; H01B 1/22
    USPC .......................................................... 156/60
    See application file for complete search history.

(56) References Cited

U.S. PATENT DOCUMENTS

| | | | | |
|---|---|---|---|---|
| 2015/0208511 A1* | 7/2015 | Ishimatsu | ................ | B32B 3/30 361/749 |
| 2016/0351532 A1* | 12/2016 | Akutsu | ................ | H05K 1/0269 |
| 2017/0103959 A1* | 4/2017 | Akutsu | .................... | H01B 1/22 |
| 2017/0207190 A1* | 7/2017 | Tsukao | .................... | H01L 24/14 |

FOREIGN PATENT DOCUMENTS

| | | | | |
|---|---|---|---|---|
| JP | 4887700 B2 | 2/2012 | | |
| JP | 2014-063729 A | 4/2014 | | |
| WO | WO-9745893 A1 * | 12/1997 | ............... | H01R 4/04 |

OTHER PUBLICATIONS

Dec. 15, 2015 International Search Report issued in International Patent Application No. PCT/JP2015/078012.

Dec. 15, 2015 Written Opinion of the International Searching Authority issued in International Patent Application No. PCT/JP2015/078012.

Jan. 16, 2018 Office Action issued in Japanese Patent Application No. 2014-219785.

* cited by examiner

ANISOTROPIC CONDUCTIVE FILM AND CONNECTION STRUCTURE

TECHNICAL FIELD

The present invention relates to an anisotropic conductive film, a connection method using the anisotropic conductive film, and a connection structure connected via the anisotropic conductive film.

BACKGROUND ART

Anisotropic conductive films are widely used when electronic components such as IC chips are mounted on substrates. In recent years, demand has arisen for high density wiring/interconnections in small electronic devices such as mobile phones, and notebook computers. A technique is known for utilizing an anisotropic conductive film in such high density wiring/interconnections, in which electrically conductive particles are evenly disposed in a matrix in an electrically insulating adhesive layer of the anisotropic conductive film.

However, there is a problem in that variations in connection resistance occur even though the electrically conductive particles are evenly disposed. This is because there are cases where the electrically conductive particles located on the edges of terminals are not sandwiched by vertically opposing terminals. To solve this problem, a technique has been proposed in which a first row direction of electrically conductive particles is configured as the longitudinal direction of an anisotropic conductive film, and a second row direction crossing the first row direction is configured to be inclined at not less than 5° and not greater than 15° with respect to a direction orthogonal to the longitudinal direction of the anisotropic conductive film (Patent Literature 1).

CITATION LIST

Patent Literature

Patent Literature 1: Japanese Patent No. 4887700B

SUMMARY OF INVENTION

Technical Problem

However, for example, in cases of FPC on Glass (FOG) connections in which a liquid crystal panel is connected to an FPC, it has been difficult to obtain reliable conduction with the conventional anisotropic conductive films described above when the size of the connecting bumps becomes smaller and the pitch of the bumps becomes finer. To solve this problem, simply increasing the disposition density of the electrically conductive particles in the anisotropic conductive film has been considered. However, there is still a possibility that the electrically conductive particles will not be sufficiently captured between opposing terminals that are anisotropically conductively connected even if the disposition density of the electrically conductive particles is increased. Moreover, there is a problem in that the possibility of short-circuiting increases due to the increased disposition density of the electrically conductive particles. Additionally, there are problems in that the number of electrically conductive particles not involved with the connection increases unnecessarily, which leads to increases in the manufacturing cost of the anisotropic conductive film.

As such, an object of the present invention is to enable opposing terminals to be stably connected using an anisotropic conductive film, enable easier inspection after the connecting, and reduce the number of electrically conductive particles not involved in the connection, thereby reducing the manufacturing cost of the anisotropic conductive film, even in FOG connections or the like with finer bump pitches.

Solution to Problem

The present inventor discovered the following which resulted in the completion of the present invention:

(1) In some cases, conduction cannot be obtained and/or short-circuiting occurs when using, in a FOG connection, an anisotropic conductive film in which electrically conductive particles are evenly disposed and the disposition density of the electrically conductive particles is simply increased. A reason for the lack of conduction is because the electrically insulating resin melted at a time of anisotropic conductive connecting flows in the longitudinal direction of the terminals. This results in the electrically conductive particles originally located on the terminal flowing off the terminal and makes it impossible for the terminal to capture the electrically conductive particles. Additionally, a reason for the short-circuiting is because the electrically conductive particles flow between terminals that are neighboring in the horizontal direction, which results in the electrically conductive particles becoming connected to each other and causing the neighboring terminals to short circuit;

(2) When the electrically conductive particles are disposed in a lattice in the electrically insulating adhesive layer, such situations can be effectively prevented by providing narrow and wide intervals between neighboring rows to form regions of dense electrically conductive particles and regions of sparse electrically conductive particles in the anisotropic conductive film. When opposing terminals are anisotropically conductively connected, the regions of dense electrically conductive particles are disposed between opposing terminals and the regions of sparse electrically conductive particles are disposed outside of the opposing terminals;

(3) By forming these regions of sparse electrically conductive particles, the number of electrically conductive particles not involved in the connection can be reduced and, thus, the manufacturing cost of the anisotropic conductive film can be reduced; and (4) When regions of sparse electrically conductive particles and regions of dense electrically conductive particles are formed in the anisotropic conductive film, products can more easily be inspected after connecting by observing the density distribution of the electrically conductive particles.

Specifically, the present invention provides an anisotropic conductive film including an electrically insulating adhesive layer and electrically conductive particles disposed in the electrically insulating adhesive layer. In such an anisotropic conductive film, the electrically conductive particles are disposed in a lattice by being arranged in first direction rows and second direction rows; and narrow and wide intervals are provided between neighboring rows in at least one direction rows.

Additionally, the present invention provides a connection method for anisotropically conductively connecting a terminal of a first electronic component and a terminal of a second electronic component using the anisotropic conductive film described above. This connection method includes, among sparse disposition regions and dense disposition regions of electrically conductive particles formed by providing narrow and wide intervals between arrangements of the electrically conductive particles in the anisotropic conductive film, disposing the dense regions between opposing terminals.

Furthermore, the present invention provides a connection structure, including a first electronic component and a second electronic component, wherein the first electronic component and the second electronic component are anisotropically conductively connected via the connection method described above.

Advantageous Effects of Invention

According to the anisotropic conductive film of the present invention, the electrically conductive particles are disposed in a lattice and narrow and wide intervals are provided between the rows of the electrically conductive particles that form the lattice disposition. As a result, regions of sparse electrically conductive particles and regions of dense electrically conductive particles are formed. Accordingly, when opposing terminals are anisotropically conductively connected using the anisotropic conductive film, the regions of dense electrically conductive particles are disposed between the opposing terminals and the regions of sparse electrically conductive particles are disposed in regions outside the opposing terminals. As a result, electrically conductive particles sufficient for ensuring conduction can be captured on the terminals and short-circuiting between neighboring terminals can be prevented, even if the electrically conductive particles flow in the longitudinal direction of the terminals due to the electrically insulating resin being melted at the time of anisotropic conductive connecting.

Additionally, due to the regions of spare electrically conductive particles and the regions of dense electrically conductive particles being formed in the anisotropic conductive film, it is easier to inspect products after connecting by observing the density distribution of the electrically conductive particles. Image analysis software or the like is used for such inspections, and the inspections can be easily performed by measuring deviations of the electrically conductive particles from preset locations. Note that inspections using image analysis software may be performed at a time of manufacturing the anisotropic conductive film or before and after performing anisotropic conductive connecting.

Furthermore, according to the anisotropic conductive film of the present invention, the number of electrically conductive particles not involved in the connection can be reduced and, thus, the manufacturing cost of the anisotropic conductive film can be reduced.

DESCRIPTION OF EMBODIMENTS

Next, the present invention will be described in detail while referring to the drawings. Note that in the drawings, identical reference signs indicate the same constituents.

Figure 1:
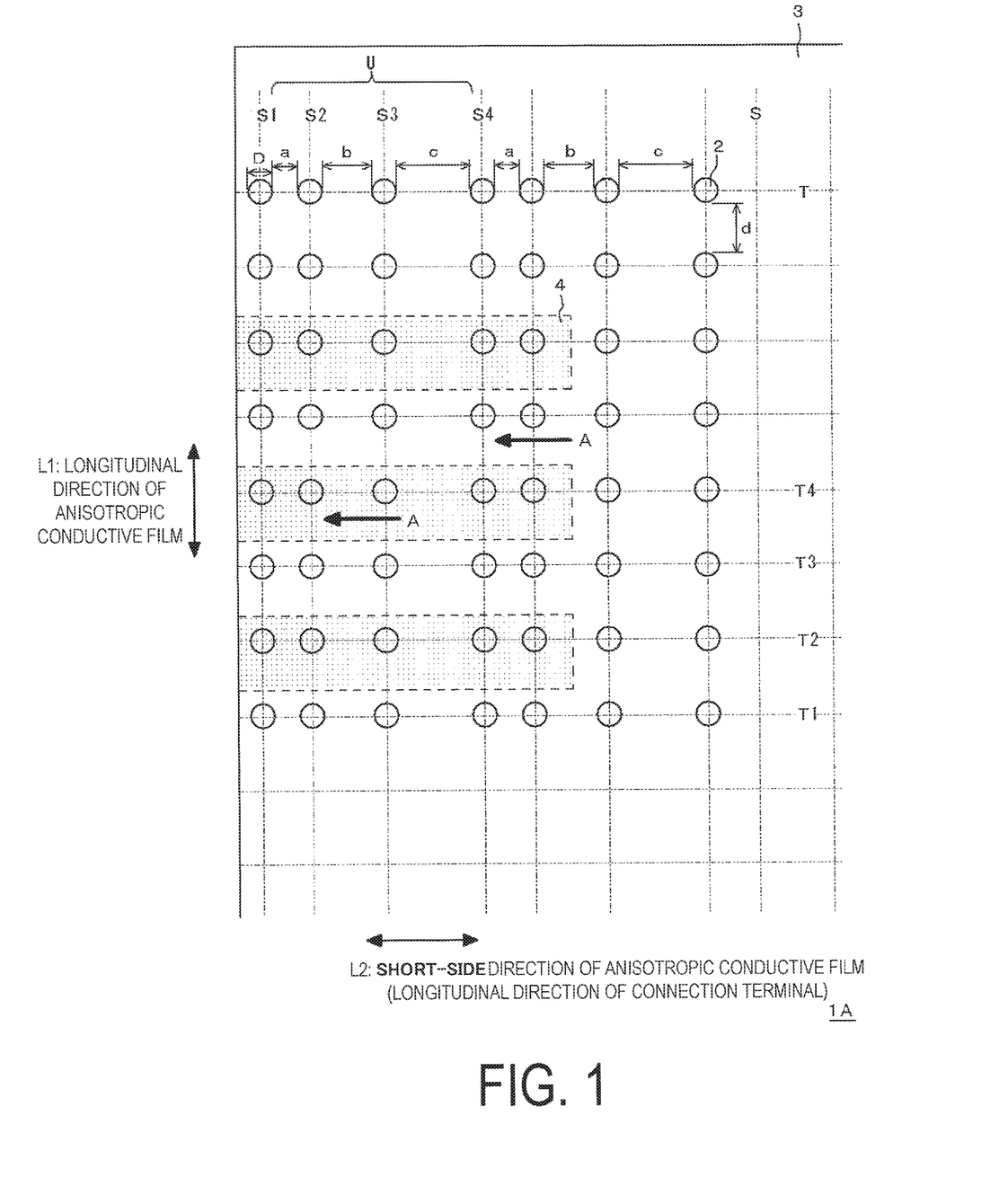
FIG. 1 is a disposition diagram of electrically conductive particles in an anisotropic conductive film 1A of the Examples.

FIG. 1 is a disposition diagram of electrically conductive particles 2 in an anisotropic conductive film 1A of an embodiment of the present invention. In this anisotropic conductive film 1A, the electrically conductive particles 2 are arranged in first direction rows and second direction rows, thereby being disposed in a lattice in an electrically insulating adhesive layer 3. More specifically, the electrically conductive particles 2 are disposed in first direction rows S (S1, S2, S3, S4 . . . ) parallel with a longitudinal direction L1 of the anisotropic conductive film 1A, and second direction rows T (T1, T2, T3, T4 . . . ) parallel with a short-side direction L2 of the anisotropic conductive film 1A.

Among these, the first direction rows S are provided with narrow and wide intervals between neighboring rows, and these narrow and wide intervals repeat. That is, an inter-row unit U is repeated such that $a<b<c$, where a, b, and c are three distances between neighboring rows. Here, $a \geq 0$ and when $a=0$, the neighboring electrically conductive particles are in contact with each other.

On the other hand, the second direction rows T are formed at equal intervals.

As a result of the first direction rows and the second direction rows, the anisotropic conductive film 1A is provided with regions of sparse disposition density and regions of dense disposition density of the electrically conductive particles 2.

Figure 2:
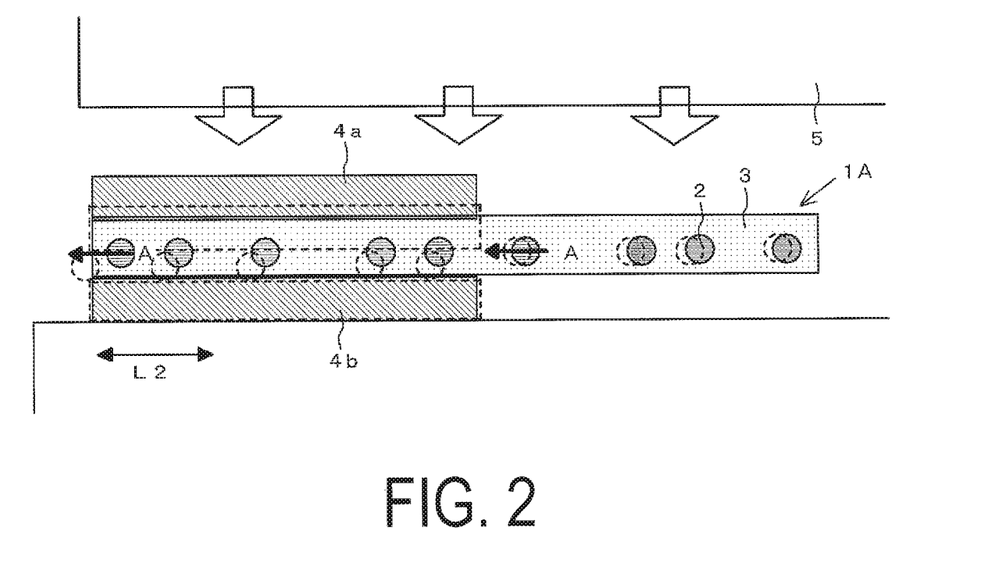
FIG. 2 is a cross-sectional view at a time of anisotropic conductive connecting using the anisotropic conductive film 1A of the Examples.

In cases where a terminal of a first electronic component and a terminal of a second electronic component are anisotropically conductively connected using the anisotropic conductive film 1A, it is preferable that a longitudinal direction of terminals 4 indicated by the dash lines in FIG. 1 be configured to be parallel to the second direction rows T, and the first direction rows S be oriented so as to cross the longitudinal direction of the terminals 4. As illustrated in FIG. 2, at a time of anisotropic conductive connecting, terminals 4a and 4b and the anisotropic conductive film 1A are arranged such that the region of the anisotropic conductive film 1A where the electrically conductive particles 2 are dense is sandwiched between the terminal 4a of the first electronic component and the terminal 4b of the second electronic component; and are heat pressed using a heater 5 provided with a pressing surface of a size that covers the rows of the terminals 4a and 4b. During the heat pressing, the resin forming the electrically insulating adhesive layer 3 melts. Due to the terminals 4a and 4b existing on the edge side of the pressing surface of the heater 5, when the melted resin flows in the longitudinal direction (arrow A) of a terminal 4, the electrically conductive particles 2 on the terminals 4a and 4b and also the electrically conductive particles 2 between the terminals neighboring in the horizontal direction (between neighboring terminals 4a or between neighboring terminals 4b) move in the direction of the arrow A. However, because the region of the anisotropic conductive film 1A where the electrically conductive particles 2 are dense is sandwiched between the terminals 4a and 4b, even if there are electrically conductive particles 2 that flow away from the terminals 4a and 4b due to the flow of the resin, electrically conductive particles 2 sufficient to ensure the conduction of the terminals 4a and 4b can be captured. Therefore, the terminals 4a and 4b are connected by the electrically conductive particles 2, as depicted by the dash lines. Additionally, the region where the electrically conductive particles 2 are sparse exists in the direction of the arrow A on the outside of the region formed between the neighboring terminals and juxtaposed with the terminals. Therefore, compared to cases in which only regions of dense electrically conductive particles 2 are formed, the electrically conductive particles 2 can be prevented from connecting to each other due to the movement of the electrically conductive particles 2 in the direction A and, particularly, connecting of three or more of the electrically conductive particles 2 can be prevented. As a result, short-circuiting between terminals neighboring in the horizontal direction due to connected electrically conductive particles 2 can be prevented.

Here, to reliably capture the electrically conductive particles 2 on each of the terminals 4 at the time of anisotropic conductive connecting, it is preferable that the sum of the three distances a, b, and c between the neighboring rows be less than the length in the longitudinal direction of the terminal 4. This is because, from the perspective of the stability of the anisotropic connection, at least three of the electrically conductive particles preferably exist on the terminal.

Additionally, there is a concern in that if the sparse/dense balance of the electrically conductive particles 2 is lost, uneven contact could occur due to the same trend occurring throughout the entirety of the terminal rows that are formed at a predetermined pitch, and reliability and the like would be negatively affected. On this point, to ensure the uniformity of the electrically conductive particles at the time of pressing, the distance b is preferably not less than 0.5 times, more preferably from 0.5 to 150 times, and even more preferably from 0.75 to 100 times a particle size of the electrically conductive particles 2. The distance c is preferably 0.5× an integral multiple with respect to the distance b. This is because with such a configuration, it will be easy to compare the distance c with the distance b.

Furthermore, to facilitate pass/fail judgment before and after the connecting, the distances a, b, and c preferably are provided with a geometric relationship. In an example of such a configuration, b/a=c/b=1.2 to 5. Alternatively, if the distance is configured as an integral multiple ½ the particle size, one particle can be used as the criteria (measure). As a result, the uniformity of the pressing is easily recognized even after the anisotropic conductive connecting and, therefore, connection problems in connection structures are easily determined.

On the other hand, from the perspective of preventing short-circuiting and improving conduction reliability, the intervals between the second direction rows T1, T2, T3, T4 . . . that are parallel to the short-side direction of the anisotropic conductive film 1A preferably are configured to be not less than 0.5 times the average size of the electrically conductive particles. This distance is appropriately calculated on the basis of the bump layout of the anisotropic connection. This is because it is not possible to perfectly predict the direction that the resin melted at the time of anisotropic conductive connecting will flow, and flow of the resin may be random on the terminals or thereabout.

In the anisotropic conductive film 1A, from the perspective of preventing short-circuiting and the stability of the connection of the opposing terminals, a particle size D of the electrically conductive particles 2 is preferably from 1 to 10 μm.

A density of the electrically conductive particles 2 is preferably from 2000 to 250000 particles/mm². This particle density is appropriately adjusted depending on the particle size and the direction in which the electrically conductive particles 2 are disposed.

In the anisotropic conductive film 1A, the constituent material of the electrically conductive particles 2 themselves and the layer structure or constituent resin of the electrically insulating adhesive layer 3 can take various forms.

That is, any material used in conventional anisotropic conductive films may be appropriately selected and used as the electrically conductive particles 2. Examples thereof include nickel, cobalt, silver, copper, gold, palladium, and similar metal particles, metal-coated resin particles, and the like. A combination of two or more materials may also be used.

Any electrically insulating resin layer used in conventional anisotropic conductive films may be appropriately used as the electrically insulating adhesive layer 3. Examples thereof include a photo-radical polymerization type resin layer containing an acrylate compound and a photo-radical polymerization initiator, a thermal radical polymerization type resin layer containing an acrylate compound and a thermal radical polymerization initiator, a thermal cationic polymerization type resin layer containing an epoxy compound and a thermal cationic polymerization initiator, a thermal anionic polymerization type resin layer containing an epoxy compound and a thermal anionic polymerization initiator, and the like. Additionally, as necessary, polymerized products of these resin layers may be used. Moreover, the electrically insulating adhesive layer 3 may be formed from a plurality of resin layers.

The anisotropic conductive film of the present invention can take various forms. For example, as with an anisotropic conductive film 1B illustrated in FIG. 3, in contrast with the anisotropic conductive film 1A described above, a configuration is possible in which the first direction rows S parallel with the longitudinal direction L1 of the anisotropic conductive film are configured at even intervals, and the second direction rows T parallel with the short-side direction of the anisotropic conductive film 1B are provided with narrow and wide intervals. That is, the unit U is repeatedly provided in the second direction rows T such that a<b<c, where a, b, and c are three distances between neighboring rows in the second direction rows T.

Figure 3:
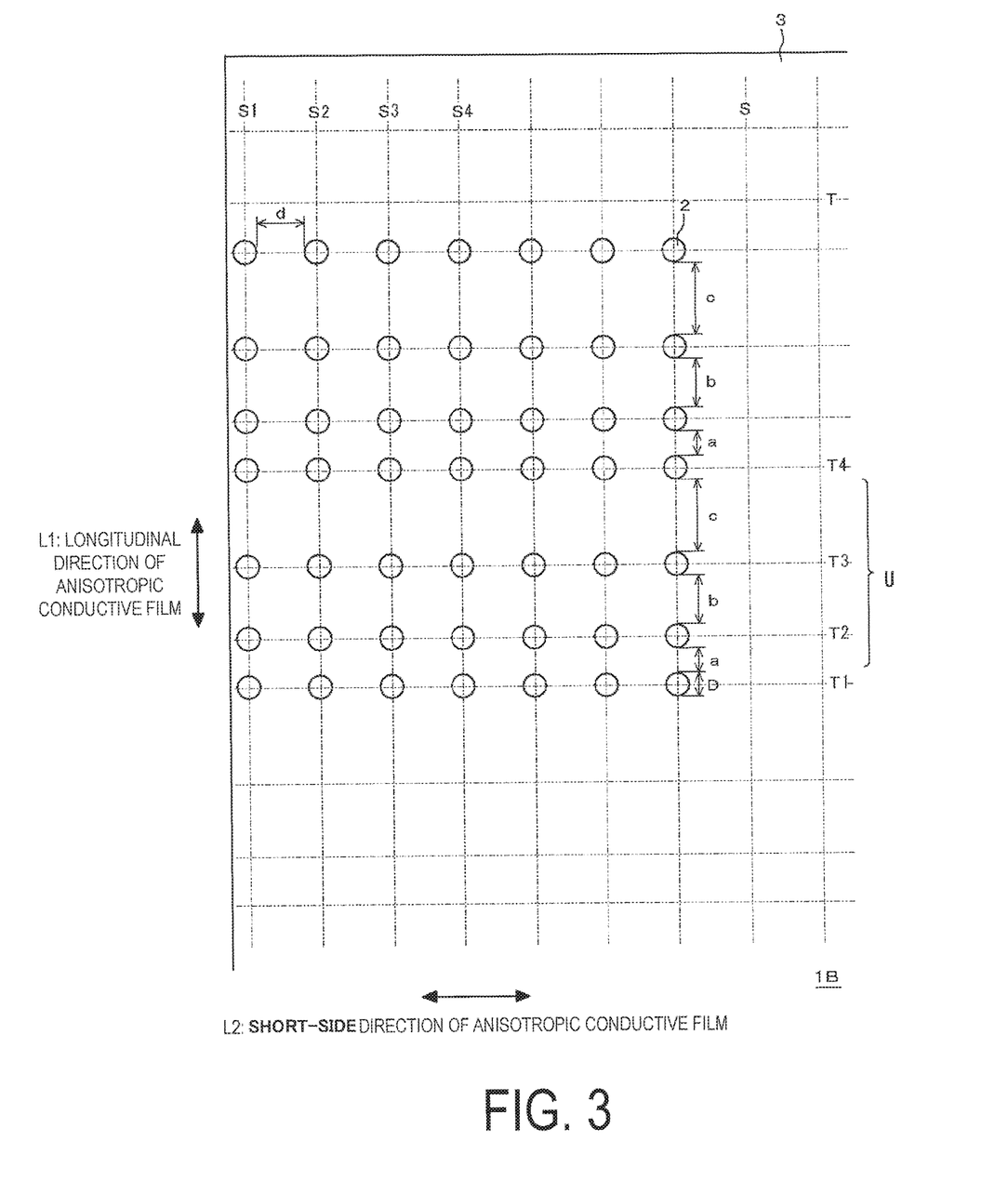
FIG. 3 is a disposition diagram of electrically conductive particles in an anisotropic conductive film 1B of the Examples.

In this case, as with the distances a, b, and c between the rows S in the anisotropic conductive film 1A, the distance b between the rows T is preferably not less than 0.5 times, more preferably from 0.5 to 150 times, and even more preferably from 0.75 to 100 times a particle size of the electrically conductive particles 2. Additionally, the sum of the distances a, b, and c is preferably configured to be less than 0.4 mm.

In the anisotropic conductive film 1B, the interval between the first direction rows S is preferably configured to be not less than 0.5 times and is more preferably configured to be an integral multiple of ½ the particle size of the electrically conductive particles 2. This allows the rows of electrically conductive particles to be used as one criteria (measure) for determining the state after the anisotropic conductive connecting.

A length of the bumps sometimes exceeds the short-side direction (width) of the film and, as such, there is no need to impose an upper limit on the number of electrically conductive particles that exist in the longitudinal direction of the bumps. However, there are preferably three or more and more preferably four or more of the electrically conductive particles in the short-side direction (width) of the anisotropic conductive film at the time of connecting.

As described above, the anisotropic conductive film 1B is provided with narrow and wide intervals between the second direction rows T. As such, in cases where the resin melted at the time of anisotropic conductive connecting flows in the short-side direction of the terminals 4, the capturing performance of the electrically conductive particles 2 on the terminals 4 can be ensured and short-circuiting can be prevented.

Figure 4:
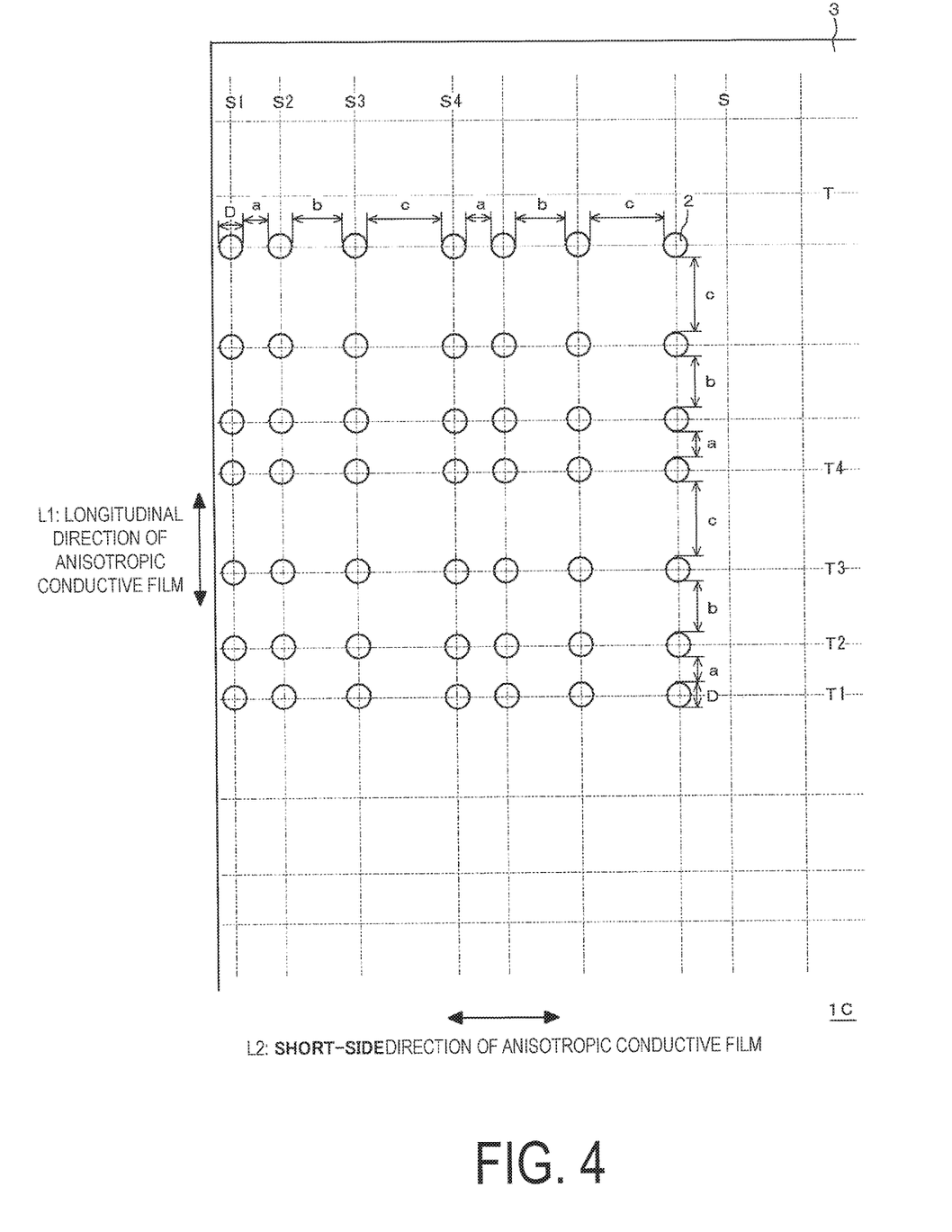
FIG. 4 is a disposition diagram of electrically conductive particles in an anisotropic conductive film 1C of the Examples.

Additionally, as with an anisotropic conductive film 1C illustrated in FIG. 4, in contrast with the anisotropic conductive film 1A described above, a configuration is possible in which the first direction rows S parallel with the longitudinal direction L1 of the anisotropic conductive film are provided with narrow and wide intervals and, also, the second direction rows T parallel with the short-side direction of the anisotropic conductive film 1C are provided with narrow and wide intervals.

In this case, narrow and wide intervals are provided between both the first direction rows S and the second direction rows T. As such, even in cases where the resin melted on the terminal 4 or thereabout at the time of anisotropic conductive connecting flows randomly, the capturing performance of the electrically conductive particles 2 on the terminal 4 can be ensured and short-circuiting can be prevented.

Furthermore, in the anisotropic conductive films 1A, 1B, and 1C described above, in the case where two narrow and wide distances a and b between neighboring rows are provided and these narrow and wide distances are repeated between the rows, the repeating unit may be constituted by only the two distances a and b between the rows.

From the perspective of easily recognizing the rows of the electrically conductive particles in the anisotropic conductive film (reducing the number of steps in the inspection process), the repeating unit preferably spans across three or more intervals between the rows, and distances a<b<c are preferably satisfied. This is because long/short is easily identified when there are three distance settings between the rows compared to two. This configuration is particularly effective when the difference between distances a and b is comparatively small.

Furthermore, the distance c between the rows may be configured to be double a distance between the rows in a case where the narrow and wide distances between the rows are not provided, and one of the rows in the lattice arrangement of the electrically conductive particles may be repeatedly eliminated.

Additionally, the first direction rows S and the second direction rows T need not be orthogonal to each other. One or both of the rows may be inclined with respect to the longitudinal direction of the anisotropic conductive film. Typically, rows of terminals to be anisotropically connected are constituted by terminals 4 having the same rectangular shape being arranged at a predetermined interval in a single direction. As such, one or both of the first direction rows S and the second direction rows T are configured as rows inclined with respect to the longitudinal direction of the anisotropic conductive film and stacked on the row of terminals to be anisotropically connected. This allows detection to be comparatively easier in cases where there is an abnormality in the lattice arrangement of the electrically conductive particles.

An example of a method for fixing the electrically conductive particles 2 in the electrically insulating adhesive layer 3 at the arrangement described above includes fabricating a mold having recesses corresponding to the arrangement of the electrically conductive particles 2 by machining, laser processing, photolithography, or the like; placing the electrically conductive particles into the mold; filling the mold with an electrically insulating adhesive layer forming composition; curing; and removing the product from the mold. A mold made from a material with lower rigidity may be fabricated from this mold.

Additionally, a method including providing a member, which includes through-holes defined in a predetermined arrangement, on the electrically insulating adhesive layer forming composition; supplying the electrically conductive particles 2 from there above; and causing the electrically conductive particles 2 to pass through the through-holes may be used to place the electrically conductive particles 2 in the electrically insulating adhesive layer 3 at the arrangement described above.

Additionally, in cases where the terminal of an IC chip, an IC module, a liquid crystal panel or similar first electronic component and the terminal of a flexible board or similar second electronic component are anisotropically conductively connected by use of the anisotropic conductive film of the present invention, and in cases where the terminal of an IC chip, an IC module, or similar first electronic component and the terminal of a glass board or similar second electronic component are anisotropically conductively connected by use of the anisotropic conductive film of the present invention, as illustrated in FIG. 1, of regions of sparse electrically conductive particle 2 and regions of dense electrically conductive particle 2 formed by providing the narrow and wide intervals between the rows of the electrically conductive particles 2 in the anisotropic conductive film, the regions of dense electrically conductive particles 2 are disposed between the opposing terminals 4. The present invention also includes connection structures connected in this manner.

Particularly, from the perspective of preventing short-circuiting between the terminals in the connection structure, the rows provided with the narrow and wide intervals between the rows of electrically conductive particles is preferably arranged so as to cross the longitudinal direction of the terminals.

EXAMPLES

Next, the present invention will be described in detail on the basis of examples.

Examples 1 to 10, Comparative Examples 1 and 2

To investigate the relationship between the arrangement of the electrically conductive particles in the anisotropic conductive film and conduction characteristics, the anisotropic conductive films shown in Table 1 were manufactured. Here, AUL704 (manufactured by Sekisui Chemical Co., Ltd.; Particle size: 4 µm) was used as the electrically conductive particles, and the electrically insulating adhesive layer was formed as follows from a mixed solution containing 60 parts by mass of YP-50 (manufactured by Nippon Steel & Sumikin Chemical Co., Ltd.; thermoplastic resin), 60 parts by mass of jER828 (manufactured by Mitsubishi Chemical Corporation; thermosetting resin), and 2 parts by mass of SI-60L (manufactured by Sanshin Chemical Industry Co., Ltd.; latent curing agent). Specifically, this mixture was coated on a PET film having a film thickness of 50 μm, and dried in an oven at 80° C. for 5 minutes. Thus, an adhesive layer having a thickness of 20 -82 m was formed on the PET film.

On the other hand, molds having convex row patterns at the arrangements illustrated in Table 1 were fabricated, conventionally known transparent resin pellets were melted and, while melted, poured into the molds, and the melted transparent resin was cooled and allowed to harden. Thus, resin molds having convexities in the row patterns illustrated in Table 1 were formed. The convexities of the resin molds were filled with the electrically conductive particles, and the adhesive layer, namely the electrically insulating adhesive layer described above, was placed thereon. Then, the curable resin included in the electrically insulating adhesive layer was cured by UV curing. Then, the electrically insulating adhesive layer was peeled from the mold. Thus, the anisotropic conductive films of the Examples and Comparative Examples were manufactured.

Note that in Comparative Example 1, the electrically conductive particles were disposed randomly on the same plane by disposing the electrically conductive particles in a low-boiling point solvent and then spraying the mixture at the target.

Evaluation

The (a) initial conduction resistance, (b) conduction reliability, and (c) number of connected particle clusters of the anisotropic conductive films of the Examples and the Comparative Examples were each evaluated as follows. Results are shown in Table 1.

(a) Initial Conduction Resistance

The anisotropic conductive film of each of the Examples and the Comparative Examples was sandwiched between a flexible printed circuit (FPC) and a glass board and heat pressed (180° C., 80 MPa, 5 seconds) so as to obtain each connected object for evaluation. Conduction resistance of each connected object for evaluation was measured.

Here, the terminal patterns of the FPC and the glass board corresponded to each other, and sizes thereof were as described below.

Additionally, the longitudinal direction of the anisotropic conductive film and the short-side direction of the bumps were aligned and affixed to each other.

FPC
  Bump pitch: 32 μm
  Bump width: 16 μm; Space between bumps: 16 μm
  Bump length: 1 mm
Glass board
  ITO Solid Glass (b) Conduction Reliability The conduction resistance after placing the connected objects for evaluation, fabricated in (a) using the anisotropic conductive films of the Examples and the Comparative Examples, in a thermostatic chamber set to a temperature of 85° C. and a humidity of 85% RH for 500 hours was measured in the same manner as (a). Note that from the perspective of practical conduction stability of a connected electronic component, the conduction resistance preferably does not exceed 5 Ω.

(c) Number of Connected Particle Clusters

The connected objects for evaluation, fabricated in (a) using the anisotropic conductive films of the Examples and the Comparative Examples, were observed under a microscope, the number of connected particle clusters where two or more of the electrically conductive particles were connected was counted, and the number of connected particle clusters per 100 electrically conductive particles was calculated.

TABLE 1-1

Figure 5:
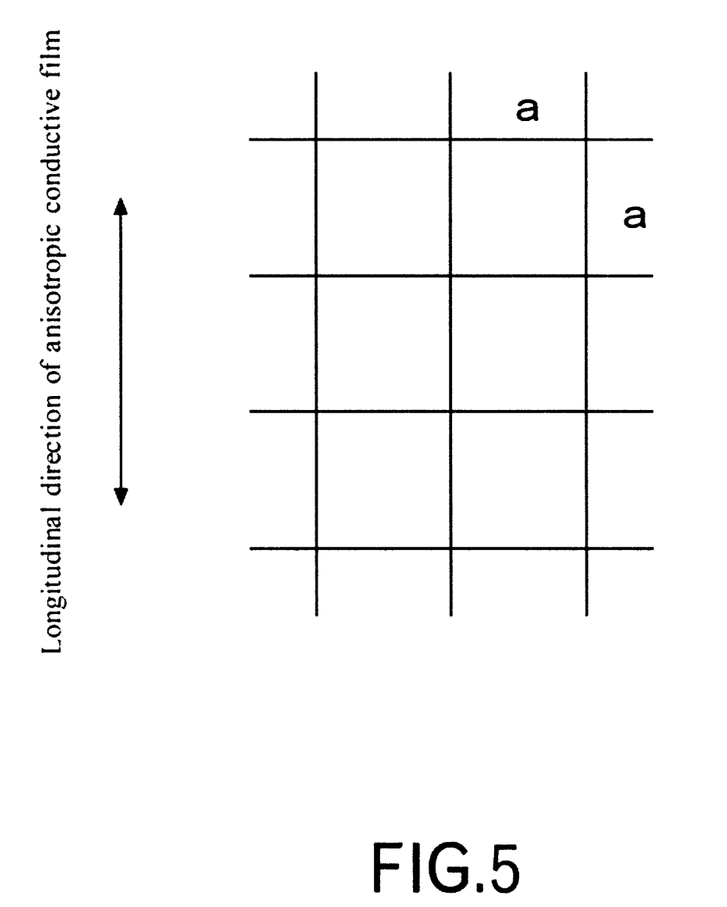
FIG. 5 is a disposition diagram of electrically conductive particles in an anisotropic conductive film of Comparative Example 2.

|  |  |  | Comparative Example 1 | Comparative Example 2 | Example 1 | Example 2 | Example 3 |
|---|---|---|---|---|---|---|---|
| Electrically conductive particle size (μm) |  |  | 4 | 4 | 4 | 4 | 4 |
| Number density of electrically conductive particles (particles/mm²) |  |  | 17400 | 17400 | 17400 | 14400 | 12100 |
| Row pattern of electrically conductive particles |  |  | Random | Square lattice (FIG. 5) | FIG. 3 | | |
| Distance between rows | a | (μm) | — | 3.6 | 2 | 2 | 4 |
|  | b | (μm) | — |  | 3 | 4 | 6 |
|  | c | (μm) | — |  | 4.5 | 8 | 9 |
|  | d | (μm) | — |  | 4 | 4 | 4 |
| (a) Initial Conduction Resistance | | (Ω) | 1.3 | 1.2 | 1.2 | 1.2 | 1.8 |
| (b) Conduction Reliability | | (Ω) | 4 | 4 | 4 | 4.5 | 5 |
| (c) Number of Connected Particle Clusters (per 100 particles) | | | 25 | 20 | 14 | 6 | 2 |

TABLE 1-2

|  | Example 4 | Example 5 | Example 6 | Example 7 | Example 8 | Example 9 | Example 10 |
|---|---|---|---|---|---|---|---|
| Electrically conductive particle size (μm) | 4 | 4 | 4 | 4 | 4 | 4 | 3 |

TABLE 1-2-continued

| | | | Example 4 | Example 5 | Example 6 | Example 7 | Example 8 | Example 9 | Example 10 |
|---|---|---|---|---|---|---|---|---|---|
| Number density of electrically conductive particles (particles/mm²) | | | 17400 | 14400 | 12100 | 19500 | 13300 | 9400 | 12300 |
| Row pattern of electrically conductive particles | | | | FIG. 1 | | | FIG. 4 | | FIG. 1 |
| Distance between rows | a | (μm) | 2 | 2 | 4 | 2 | 2 | 4 | 3 |
| | b | (μm) | 3 | 4 | 6 | 3 | 4 | 6 | 6 |
| | c | (μm) | 4.5 | 8 | 9 | 4.5 | 8 | 9 | 9 |
| | d | (μm) | 4 | | 4 | 4 | | | |
| (a) Initial Conduction Resistance | | (Ω) | 1.3 | 1.8 | 2.2 | 1.3 | 1.2 | 1.3 | 2.1 |
| (b) Conduction Reliability | | (Ω) | 4 | 4.5 | 5 | 4 | 4 | 4 | 5 |
| (c) Number of Connected Particle Clusters (per 100 particles) | | | 12 | 8 | 4 | 8 | 4 | 2 | 4 |

From Table 1, it is clear that the number of connected particle clusters in the connected objects for evaluation of Examples 1 to 10 was significantly less than the number of connected particle clusters in the connected object for evaluation of Comparative Example 1 and that short-circuiting does not occur as easily. The number of connected particle clusters in the connected objects for evaluation of Examples 1 to 10 was less than the number of connected particle clusters in the connected object for evaluation of Comparative Example 2. Moreover, while the locations where the connected particles formed were random in Comparative Example 2, regularity was found in the Examples. That is, it was confirmed that the locations where short-circuiting occurs are controlled and that short-circuiting risk itself was reduced.

Additionally, the number density of the electrically conductive particles in each of the anisotropic conductive films of Examples 2, 3, 5, 6, 8, 9, and 10 was less than the anisotropic conductive films of Comparative Examples 1 and 2. Regardless of this, it is clear that the anisotropic conductive films of Examples 2, 3, 5, 6, 8, 9, and 10 displayed initial conduction and conduction reliability of the same level as the connected objects for evaluation of Comparative Examples 1 and 2, the number of electrically conductive particles needed to ensure conduction could be reduced, and the manufacturing cost of the anisotropic conductive film could be reduced.

REFERENCE SIGNS LIST 1A, 1B, 1C Anisotropic conductive film
2 Electrically conductive particle
3 Electrically insulating adhesive layer
4, 4a, 4b Terminal
5 Heater
a, b, c Distance between rows
L1 Longitudinal direction of anisotropic conductive film
L2 Short-side direction of anisotropic conductive film (longitudinal direction of connection terminal)
S, S1, S2, S3, S4 First direction row
T, T1, T2, T3, T4 Second direction row
U Inter-row unit
D Particle size of electrically conductive particles

The invention claimed is:

1. An anisotropic conductive film comprising:
an electrically insulating adhesive layer; and
electrically conductive particles disposed in the electrically insulating adhesive layer;
wherein:
the electrically conductive particles are disposed in a lattice by being arranged in first direction rows and second direction rows;
for at least one of the first and second direction rows, sparse regions and dense regions of electrically conductive particles are being formed by providing wide and narrow intervals between neighboring rows; and
the wide and narrow intervals are repeatedly provided between the neighboring rows for the at least one of the first and second direction rows.

2. The anisotropic conductive film according to claim 1, wherein:
at least one of the first and second direction rows include an inter-row unit where a<b<c, where a, b, and c are three distances between neighboring rows.

3. The anisotropic conductive film according to claim 1, wherein:
the at least one of the first and second direction rows provided with the narrow and wide intervals therebetween are parallel with a longitudinal direction of the anisotropic conductive film.

4. The anisotropic conductive film according to claim 2, wherein:
distances between the at least one of the first and second direction rows in the inter-row unit geometrically change.

5. The anisotropic conductive film according to claim 2, wherein:
the distance b is not less than 0.5 times a particle size of the electrically conductive particles.

6. A connection method for anisotropically conductively connecting a terminal of a first electronic component and a terminal of a second electronic component using the anisotropic conductive film according to claim 1, the method comprising:
among sparse regions and dense regions of electrically conductive particles formed by providing wide and narrow intervals between rows of electrically conductive particles in the anisotropic conductive film, disposing the dense regions between opposing terminals.

7. The connection method according to claim 6, wherein:
rows provided with narrow and wide intervals therebetween are disposed so as to cross a longitudinal direction of the terminal.

8. A connection structure comprising:
a first electronic component; and
a second electronic component,
wherein the first electronic component and the second electronic component are anisotropically conductively connected using the anisotropic conductive film according to claim 1.

9. A method of manufacturing a connection structure, comprising:
anisotropically conductively connecting a first electronic component and a second electronic component using the anisotropic conductive film according to claim 1.

10. The anisotropic conductive film according to claim 2, wherein the distance a is more than zero.

11. The anisotropic conductive film according to claim 1, wherein in either of the first and second direction rows, distances between neighboring electrically conductive particles change regularly.

12. The anisotropic conductive film according to claim 1, wherein in both of the first and second direction rows, distances between neighboring electrically conductive particles change regularly.

13. The anisotropic conductive film according to claim 1, wherein the electrically conductive particles are metal particles or metal-coated resin particles.

14. The anisotropic conductive film according to claim 1, wherein the electrically insulating adhesive layer is formed from a plurality of resin layers.

15. The anisotropic conductive film according to claim 1, wherein the first direction rows are orthogonal to the second direction rows.

16. The anisotropic conductive film according to claim 1, wherein electrically conductive particles disposed at both ends of the first and second direction rows and corresponding electrically conductive particles in at least two of the neighboring rows are located in a same plane orthogonal to the anisotropic conductive film.

17. The anisotropic conductive film according to claim 1, wherein the dense regions of electrically conductive particles are configured to be disposed only between a terminal of a first electronic component and a terminal of a second electronic component.

* * * * *